(12) United States Patent
Guyot et al.

(10) Patent No.: US 6,335,697 B1
(45) Date of Patent: Jan. 1, 2002

(54) SIMPLIFIED METHOD OF BINARY/THERMOMETRIC ENCODING WITH AN IMPROVED RESOLUTION

(75) Inventors: Benoît Guyot, Anisy; Jean-Marie Janik, Caen, both of (FR)

(73) Assignee: U.S. Philips Corporation, New York, NY (US)

( * ) Notice: Subject to any disclaimer, the term of this patent is extended or adjusted under 35 U.S.C. 154(b) by 0 days.

(21) Appl. No.: 09/649,676

(22) Filed: Aug. 28, 2000

(30) Foreign Application Priority Data

Aug. 31, 1999 (FR) ............................. 99 10955

(51) Int. Cl.$^7$ ............................. H03M 5/00; H03M 1/00
(52) U.S. Cl. ................ 341/102; 341/144; 341/158; 341/110
(58) Field of Search .................. 341/96, 102, 103, 341/110, 144, 145, 153, 154, 158, 159, 160

(56) References Cited

U.S. PATENT DOCUMENTS

| | | | | |
|---|---|---|---|---|
| 3,400,389 A | * | 9/1968 | Heymann | 341/102 |
| 4,804,940 A | * | 2/1989 | Takigawa et al. | 341/159 |
| 5,606,318 A | * | 2/1997 | Feldman | 341/102 |

\* cited by examiner

*Primary Examiner*—Howard L. Williams
(74) *Attorney, Agent, or Firm*—Aaron Waxler

(57) ABSTRACT

The invention relates to a method of converting a binary word IN(0:P−1) into a thermometric signal T1 ... TN. In accordance with the invention, this method comprises the following steps: conversion of the binary word IN(0:P−1) into an analog signal Vin, and comparison of this analog signal Vin with a plurality of reference signals Vi (i=1 to N). The invention enables to immunize the thermometric signal from parasitic transitions of the binary word IN(0:P−1). Moreover, this method can be carried out using simple structures consuming little energy, which, in addition, do not lead to substantial decoding delays.

8 Claims, 2 Drawing Sheets

SIMPLIFIED METHOD OF BINARY/THERMOMETRIC ENCODING WITH AN IMPROVED RESOLUTION

BACKGROUND OF THE INVENTION

The invention relates to a method of converting a binary word into a thermometric signal.

A signal is referred to as a thermometric signal if it is digital and, when said signal can still be incremented, it is possible to find among the bits constituting said signal a particular bit, such that all the bits having a smaller weight than said particular bit are at a first logical level, while said particular bit and all the bits having a larger weight than said bit are at a second logical level, an increase or a decrease of the value of the thermometric signal causing, respectively, an increase or a decrease of the weight of said particular bit. Binary/thermometric conversion processes are commonly carried out within different kinds of devices, including mixed-type devices for converting a digital input signal into an analog output signal. Mixed-type devices comprise:

- a first and a second array of current sources, the outputs of which are interconnected and intended to emit the device's output signal, and
- a thermometric encoder, intended to provice an output signal for controlling the conduction of the first array of current sources, and to receive a binary input word formed by the least-significant bits of the digital input signal, the most-significant bits of said signal serving to control the conduction of the second array of current sources.

The classical binary/thermometric conversion methods generally resort to a network of logical gates. Indeed, the value of each of the bits constituting the thermometric signal may be considered to be governed by a logical equation in which bits of the binary input word play a part. Thus, each bit of the thermometric signal may come from an output of a chain of logical gates whose inputs receive bits from the binary input word.

The implementation of such a binary/thermometric conversion method has major drawbacks. First of all, the network of logical gates necessary to carry out said conversion is cumbersome and hence expensive as regards both the silicon surface necessary to form said network and its energy consumption. In addition, information is not instantaneously transferred via the chains of logical gates, leading to substantial decoding delays, which can only be reduced by increasing the size, and hence the energy consumption, of the logical gates employed. In the present state of the art, the use of such a conversion method becomes unrealistic for variation frequencies of the binary input word above 100 MHz. Finally, as the value of each one of the bits of the thermometric signal is controlled by an equation associated with said individual bit, the chains of logical gates are not identical to each other and exhibit mutually different transit times, which means that all the bits of the thermometric signal do not simultaneously obtain their appropriate value, thus causing parasitic transitions in the value of the thermometric signal, and hence also in the value of the output signal of the digital-to-analog converter. This type of conversion errors must of course be precluded.

SUMMARY OF THE INVENTION

It is an object of the invention to substantially overcome these drawbacks by proposing a binary/thermometric conversion method which does not require the use of a network of logical gates.

Indeed, a binary/thermometric conversion method as described in the opening paragraph is characterized in accordance with the invention in that it comprises the following steps:

- conversion of the binary word into an analog signal, and
- comparison of said analog signal with a plurality of reference signals.

In a method of this type, the bits of the output signal are all generated in the same way and hence do not demonstrate substantial commutation delays with respect to each other. In addition, the conversion and comparison steps can be carried out by means of simple structures which, consequently, are inexpensive and do not cause substantial decoding delays.

In a variant modification of the invention, a method as described hereinabove is characterized in that it additionally comprises a step wherein the analog signal is stored, which step is carried out between the conversion and comparison steps.

Storage of the analog signal enables the binary/thermometric conversion process to be substantially immunized from parasitic transitions of the binary input word, which occur when all the bits of said binary word do not simultaneously obtain their appropriate value.

In one of its embodiments, the invention also relates to a thermometric encoder intended to receive a binary input word and to supply a thermometric signal at a digital output, which encoder is characterized in that it comprises:

- a digital-to-analog converter intended to deliver an analog signal representative of the binary input word, and
- a plurality of comparators, each being provided with an output for emitting a digital signal representative of the result of a comparison between the value of the analog signal and a reference value, the outputs of the comparators forming the digital output of the thermometric encoder.

In this embodiment of the invention, all the bits of the output signal are simultaneously generated by the comparators, thereby precluding the occurrence of parasitic transitions in said output signal.

In a particular embodiment of the invention, the digital-to-analog converter comprises:

- a plurality of current sources, the conduction of each one of the current sources being controlled by one of the bits of the binary input word, which current sources are arranged between a first supply terminal and an output terminal of the digital-to-analog converter intended to deliver the analog signal, and
- a resistive element arranged between a second supply terminal and the output terminal of the digital-to-analog converter, each comparator being provided with means for storing its own output signal.

In this embodiment of the invention, the digital-to-analog converter has a simple structure and is inexpensive. This is made possible by virtue of the fact that the comparators store their own output signals, which is equivalent to storing the thermometric output signal. Indeed, the digital-to-analog converter above described is vulnerable to parasitic transitions of the binary input word. Storage of the thermometric output signal enables this signal to be immunized from parasitic transitions of the analog signal.

To obtain perfect immunity of the thermometric output signal with respect to parasitic transitions of the analog signal, it would be necessary, in principle, to provide the comparators with memory cells of the master-slave type, i.e. two single, successive flip-flop circuits, which are clocked by two clock signals which are in phase opposition. A variant of this embodiment enables the complexity of the means with which the comparators are provided to store their output signals to be reduced by half.

In accordance with this variant, the encoder comprises means for storing the analog signal.

This enables to provide the comparators with single flip-flop storage circuits, clocked by a same clock signal, the means for storing the analog signal being clocked by a signal which is in phase opposition with respect to said clock signal.

The reference signals used for the comparison can be generated by various means known to those skilled in the art. In a particular embodiment of the invention, the encoder described hereinabove also comprises a first resistance ladder arranged between the first and the second supply terminals and intended to be biased by means of a so-called biasing current source, a connection between two adjacent resistances being used to generate an electric potential which forms one of the reference values with which the analog signal is to be compared.

A variant of the encoder described hereinabove enables automatic and optimum calibration of the reference signals with respect to the variation range of the analog signal. According to this variant, the resistive element included in the digital-to-analog converter is composed of a second resistance ladder which, apart from one resistance, is identical to the first resistance ladder, the maximum value of the current flowing through the second resistance ladder being equal to the value of the current produced by the biasing current source.

Although the present invention can be used in all types of systems requiring a conversion of a binary word into a thermometric signal, it can be particularly advantageously employed in a digital-to-analog converting device. Therefore, the invention also relates to a device intended to convert a digital input signal to an analog output signal, comprising:

a first and a second array of current sources, the outputs of which are interconnected and intended to provide the output signal of the device, and a thermometric encoder the output signal of which is used to control the conduction of the first array of current sources, and the binary input word of which is formed by the least-significant bits of the digital input signal, the most-significant bits of this signal being used to control the conduction of the second array of current sources, said device being characterized in that the thermometric encoder is identical to that described hereinabove.

These and other aspects of the invention will be apparent from and elucidated with reference to the embodiment(s) described hereinafter.

DESCRIPTION OF THE PREFERRED EMBODIMENTS

Figure 1:
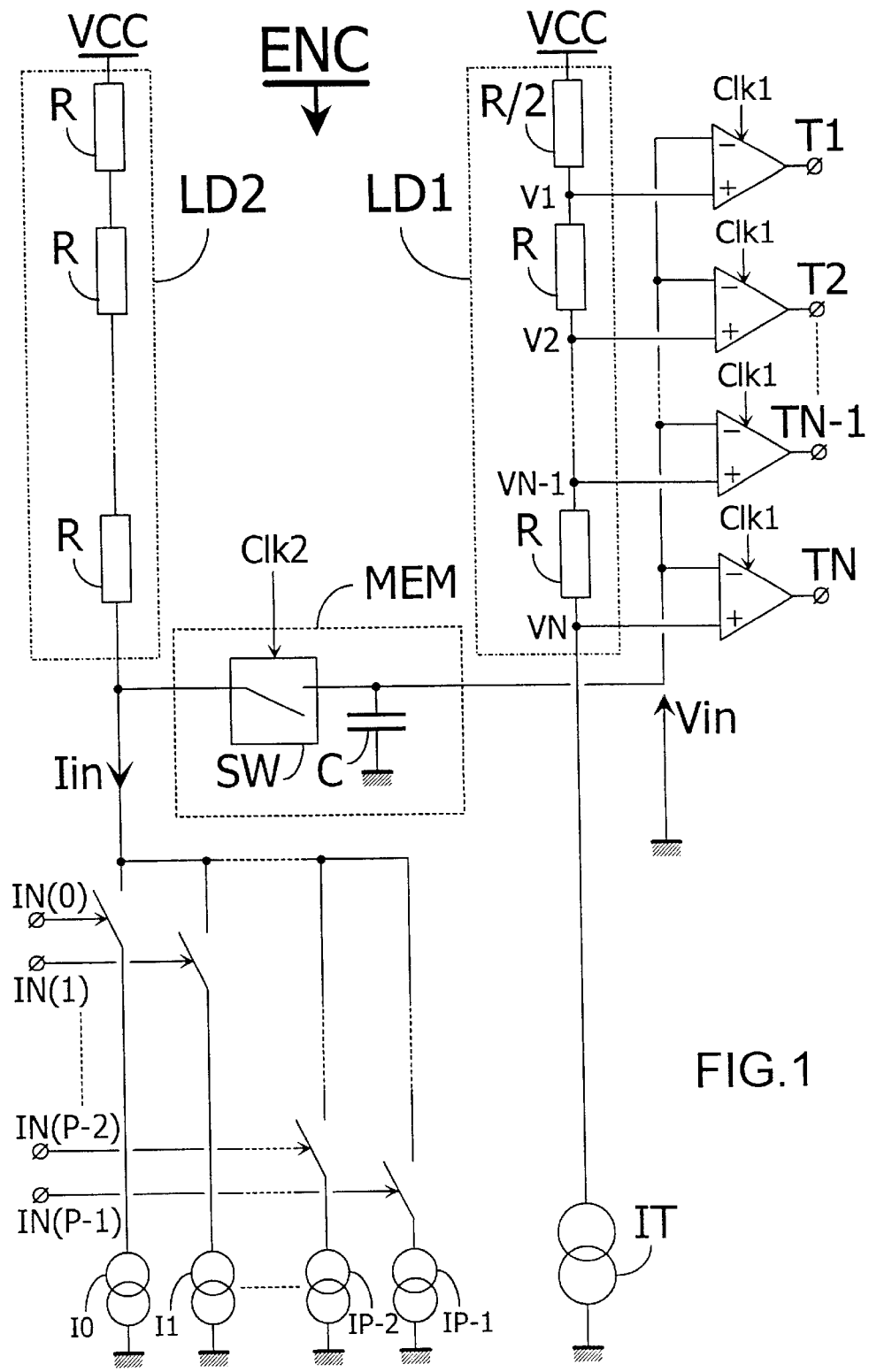
FIG. 1 is an electrical circuit diagram of a thermometric encoder carrying out a method in accordance with the invention.

FIG. 1 diagrammatically shows a thermometric encoder ENC intended to receive a binary input word IN(0:P−1) and to supply a thermometric signal T1 . . . TN to a digital output. This ENC encoder comprises:

a digital-to-analog converter intended to deliver an analog signal Vin representative of the binary input word IN(0:P−1), and a plurality of comparators, each being provided with an output for emitting a digital signal Ti (i=1 to N) representative of the result of a comparison between the value of the analog signal Vin and a reference value Vi, the outputs of the comparators forming the digital output of the thermometric encoder.

The thermometric encoder ENC additionally comprises a first ladder of N resistances LD1, which are connected in series between a first supply terminal, which in this example is formed by a ground, and a second supply terminal VCC, intended to be biased by means of a so-called biasing current source IT. Each connection between two adjacent resistances serves to generate an electric potential Vi (i=1 to N) constituting one of the reference values with which the analog signal Vin is to be compared.

In the particular embodiment described here, the digital-to-analog converter comprises a plurality of current sources I0 . . . IP−1, the conduction of each of the current sources Ij (j=0 to P−1) being controlled by one of the bits IN(j) of the binary input word IN(0:P−1). The current sources can be constructed so that each one generates a current whose value is weighted as a function of the weight of the one bit of the binary word that controls the conduction thereof. This can be expressed by $Ij=2^j I0$ (j=0 to P−1). The current sources I0 . . . IP−1 are arranged between the first supply terminal and an output terminal of the digital-to-analog converter used to emit the analog signal Vin. The digital-to-analog converter included in the encoder ENC additionally comprises a resistive element LD2 which is arranged between the second supply terminal VCC and the output terminal of the digital-to-analog converter. This resistive element is formed by a second resistance ladder, which is identical to the first ladder of N resistances LD1, with the exception that the resistances connected to the second supply terminal VCC have different values for different ladders. The maximum value of the current Iin flowing through the second ladder of N resistances LD2 is equal to the value of the current produced by the biasing current source IT. This enables optimum and automatic calibration of the reference signals Vi with respect to the variation range of the analog signal Vin.

The operation of the encoder ENC can be described as follows: if at a first point in time none of the bits of the binary input word is at the logical level 1, then the analog signal Vin is equal to VCC and hence higher than all the reference values Vi. Consequently, all the bits of the thermometric output signal T1 . . . TN are at the logical level 0. If at a second point in time only the least-significant bit I(0) is at the logical level 1, the value of the analog signal Vin is equal to VCC−N.R.I0, while the first reference value V1 is equal to VCC−IT.R/2, where IT=I0+I1+. . . IP−1, or expressed differently $IT=\Sigma 2^j.I0$. The value of the analog signal Vin thus becomes smaller than the first reference value VI, but remains larger than the second reference value V2. Consequently, only the first bit T1 of the thermometric output signal T1 . . . TN is at the logical level 1, all the others being at the logical level 0. If at a third point in time only the bit I(1) of the binary input word I(0:P−1) is at the logical level 1, the value of the analog signal Vin is equal to VCC−N.R.I1 and hence smaller than the second reference value V2, but remains larger than the third reference value. The first two bits T1 and T2 of the thermometric output signal T1 . . . TN are thus at the logical level 1, while all the others are at the logical level 0. This line of reasoning can be continued until all bits of the binary input word I(0:P−1) are at the logical level 1. The value of the analog signal Vin then is equal to VCC−N.R.IT, while the $N^{th}$ reference value VN is equal to VCC−(N−1/2).R.IT. The value of the analog signal Vin thus is smaller than the $N^{th}$ reference value VN, and all the bits of the thermometric output signal T1 . . . TN are at the logical level 1.

Each comparator is provided with means for storing its own output signal. These means are clocked by a first clock signal Clk1. Storage of the thermometric output signal T1 . . . TN makes it possible to immunize this signal T1 . . . TN from parasitic transitions of the analog signal Vin, which may occur when all the bits of the binary input word IN(0:P−1) do not simultaneously obtain their respective value, thus causing unsimultaneous commutations of the current sources I0 . . . IP−1.

To obtain perfect immunity of the thermometric output signal T1 . . . TN from parasitic transitions of the analog signal Vin, the comparators should in principle be provided with memory cells of the master-slave type, which are composed of two successive, single flip-flop circuits, clocked by two clock signals in phase opposition, i.e. in this case, the first clock signal Clk1 and its complementary signal. The embodiment described herein enables the complexity of the means with which the comparators are provided to store their output signals to be reduced by half: this can be achieved by using D latches, clocked by the single first clock signal Clk1. To this end, the encoder ENC comprises means MEM for storing the analog signal. These means include a sample and hold device composed of a switch SW and a capacitive element C, which sample and hold device is controlled by a second clock signal Clk2. When this signal is at a logical level 1, the switch SW is closed and the capacitive element C produces at its terminals a voltage, which constitutes the analog signal Vin, which reproduces the voltage delivered by the output terminal of the digital-to-analog converter. After a predetermined delay, which is sufficient to allow all bits of the binary input word to obtain their appropriate value, the second clock signal Clk2 is at the logical level 0 and the value of the analog signal Vin is stored by the capacitive element C. This value is compared with the reference values Vi (i=1 to N), the result of this comparison being in turn stored by the D latches with which the comparators are provided when the first clock signal Clk1 presents an active edge. The value of the thermometric output signal T1 . . . TN thus is not vulnerable to parasitic transitions of the binary input word IN(0:P−1). The first and the second clock signals Clk1 and Clk2 will advantageously be complementary to each other and provided with a frequency which is twice that of the variations of the binary input word IN(0:P−1).

Figure 2:
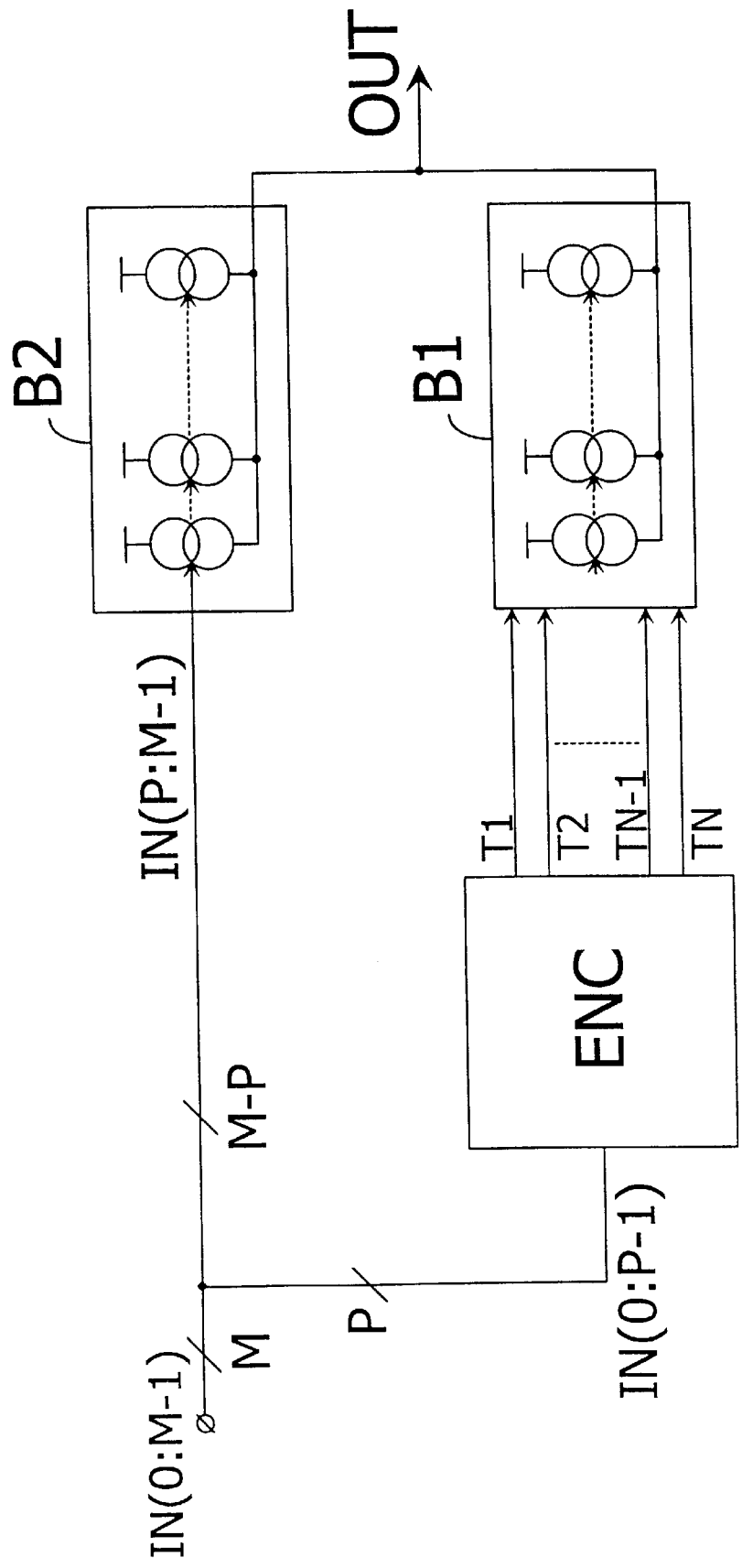
FIG. 2 is a functional diagram of a digital-to-analog converting device comprising such an encoder.

FIG. 2 is a functional diagram showing a digital-to-analog converting device including a binary/thermometric encoder in accordance with the invention. This device is intended to convert a digital input signal IN(0:M−1) to an analog output signal OUT, and comprises:

a first and a second array of current sources B1 and B2 the outputs of which are interconnected and intended to provide to emit the output signal OUT of the device, and a thermometric encoder ENC whose output signal T1 . . . TN serves to control the conduction of the first array of current sources B1, and whose binary input word IN(0:P−1) is formed by the P least-significant bits of the digital input signal IN(0:M−1), the M−P most-significant bits IN(P:M−1) of this signal IN(0:M−1) being used to control the conduction of the second array of current sources B2.

In this device, the thermometric encoder ENC is in accordance with the description given hereinabove. This makes it possible to simplify the whole structure of the device and to reduce its energy consumption, while, enabling it to proces digital input signals having a variation frequency above 100 MHz. In addition, as the thermometric output signal of the encoder ENC is substantially rendered immune from parasitic transitions which could affect the P least-significant bits of the digital input signal IN(0:M−1), the output signal OUT also benefits from such an immunity, resulting in an excellent resolution of the conversion carried out by the device.

What is claimed is:

1. A method of converting a binary word into a thermometric signal, characterized in that the method comprises the following steps:

conversion of the binary word into an analog signal, and comparison of said analog signal with a plurality of reference signals.

2. A method as claimed in claim 1, characterized in that it additionally comprises a step wherein the analog signal is stored, which step is carried out between the conversion and comparison steps.

3. A thermometric encoder intended to receive a binary input word and to supply a thermometric signal at a digital output, which encoder is characterized in that it comprises:

a digital-to-analog converter intended to deliver an analog signal representative of the binary input word, and a plurality of comparators, each being is provided with an output for emitting a digital signal representative of the result of a comparison between the value of the analog signal and a reference value, the outputs of the comparators forming the digital output of the thermometric encoder.

4. A thermometric encoder as claimed in claim 3, characterized in that the digital-to-analog converter comprises:

a plurality of current sources, the conduction of each one of the current sources being controlled by one of the bits of the binary input word, which current sources are arranged between a first supply terminal and an output terminal of the digital-to-analog converter, intended to deliver the analog signal, and a resistive element arranged between a second supply terminal and the output terminal of the digital-to-analog converter, each comparator being provided with means for storing its own output signal.

5. A thermometric encoder as claimed in claim 4, characterized in that it additionally comprises a first resistance ladder arranged between the first and the second supply terminals and intended to be biased by means of a so-called biasing current source, a connection between two adjacent resistances being used to generate an electric potential forming one of the reference values with which the analog signal is to be compared.

6. A thermometric encoder as claimed in claim 5, characterized in that the resistive element included in the digital-to-analog converter is composed of a second resistance ladder which, apart from one resistance, is identical to the first resistance ladder, the maximum value of the current flowing through the second resistance ladder being equal to the value of the current produced by the biasing current source.

7. A thermometric encoder as claimed in claim 4, characterized in that it comprises means for storing the analog signal.

8. A device for converting a digital input signal to an analog output signal, comprising:
   a first and a second array of current sources, the outputs of which are interconnected and intended to provide the output signal of the device, and
   a thermometric encoder, intended to provide an output signal for controlling the conduction of the first array of current sources, and to receive a binary input word of formed by the least-significant bits of the digital input signal, the most-significant bits of this signal being used to control the conduction of the second array of current sources, said device being characterized in that the thermometric encoder is identical to that described in claim 3.

* * * * *